United States Patent [19]

Cade

[11] 4,356,730
[45] Nov. 2, 1982

[54] ELECTROSTATICALLY DEFORMOGRAPHIC SWITCHES

[75] Inventor: Paul E. Cade, Colchester, Vt.

[73] Assignee: International Business Machines Corporation, Armonk, N.Y.

[21] Appl. No.: 223,522

[22] Filed: Jan. 8, 1981

[51] Int. Cl.³ .............................................. G01P 15/08
[52] U.S. Cl. .................................. 73/517 R; 358/231; 350/484
[58] Field of Search ....................... 73/517 R, 517 B; 340/366 R; 350/484; 357/55; 358/231; 200/61.45 R

[56] References Cited

U.S. PATENT DOCUMENTS

| | | |
|---|---|---|
| 3,001,447 | 9/1961 | Ploke . |
| 3,081,637 | 3/1963 | Gevas ........................ 73/517 R X |
| 3,137,762 | 6/1964 | Baumgartner et al. . |
| 3,746,911 | 7/1973 | Nathanson et al. ............. 315/21 R |
| 3,851,522 | 12/1974 | Peterson ...................... 73/517 R X |
| 3,886,310 | 5/1975 | Guldberg et al. ................. 358/231 |
| 3,989,890 | 11/1976 | Nathanson et al. .............. 358/231 |
| 4,203,128 | 5/1980 | Guckel et al. . |

OTHER PUBLICATIONS

The Mirror-Matrix Tube: A Novel Light Valve for Projection Displays", Transactions on Electron Devices, vol. ED-22, #9, Sep., 1975, pp. 765-775.
"Dynamic Micromechanics on Silicon: Techniques and Devices", IEEE Transactions on Electron Devices, vol. ED-25, #10, Oct., 1978.
"Micromechanical Membrane Switches on Silicon", *IBM Journal of Research and Development*, vol. 23, #4, Jul., 1979.
IBM TDB vol. 23, #1, Jun. 1980, pp. 394–395, "Color Projection Deformographic Display Using Silicon Micromechanics and Optical Diffraction".
IBM TDB vol. 20, #11A, Apr. 1978, p. 4652, M. Brady et al.

*Primary Examiner*—James J. Gill
*Attorney, Agent, or Firm*—Francis J. Thornton

[57] ABSTRACT

This describes a dual electrode electrostatically deflectable deformographic switch. The switch can be driven by co-incident voltages and can be made to retain and store information. The switch can be used either as a display or a memory and has a number of engineering advantages, for it is a direct drive display which does not need either vacuum envelopes or electron beam drives. Furthermore, greater efficiencies can be realized and no refresh is necessary since the switch will operate in a standby condition. Also only two voltage levels above ground, i.e., a write voltage and a standby voltage, are required. The switch will enable copiers to be directly driven by computers.

The switch can also be used as an optical waveguide transmit/receive switch or an accelerometer.

13 Claims, 12 Drawing Figures

ELECTROSTATICALLY DEFORMOGRAPHIC SWITCHES

DESCRIPTION OF THE INVENTION

1. FIELD OF THE INVENTION

This invention relates to electrostatically deflectable light switches used in deformographic displays and more particularly to an improved switch which can be driven by co-incident voltages.

2. DESCRIPTION OF THE PRIOR ART

Electrostatically deflectable light valves are shown in U.S. Pat. No. 3,746,911 to H. C. Nathanson, et al; U.S. Pat. No. 3,886,310 to J. Guldberg et al; U.S. Pat. No. 3,989,890 to H. C. Nathanson, et al; and described in an article entitled "The Mirror-Matrix Tube: A Novel Light Valve for Projection Displays" authored by R. N. Thomas et al, which appeared in the transactions on electron devices, Vol. ED-22, #9, Sept. 1975, on pp. 765-775.

The deflectable light valve described in this paper and the above patents requires an electron beam drive and thus a surrounding vacuum atmosphere.

In an article entitled "Dynamic Micromechanics on Silicon" appearing in the IEEE Trans. Elec. Devices, ED-25, #10, October 1975 on page 1241 and in an article entitled "Micromechanical Membranes on Silicon" appearing in the IBM Journal of Research and Development, Vol. 23, #4, July 1979, p. 376, K. Peterson described an integrated semiconductor deflectable switch. This switch is effectively a parallel plate capacitor with a voltage being applied to a metal plate on an insulating beam and to the semiconductor substrate supporting the beam such that when the applied voltage exceeds a threshold voltage, the insulating beam will be fully and non-linearly deflected towards the substrate.

However, when these devices designed by Peterson are incorporated in a large array they cannot be effectively addressed unless a dual switching arrangement is used where one of the switches acts as a relay and the other acts as the storage element. These additional relays double the required area and requires extra processing steps to be effective.

U.S. Pat. No. 4,203,128 to H. Guchel et al, describes a device using an electrostatically deformable thin silicon membrane.

U.S. Pat. No. 3,001,447 to M. Ploke, describes an image reproducing device using a thin foil which buckles when heated.

U.S. Pat. No. 3,137,762 to W. Baumgartner et al, discloses a device for amplifying the brightness of an optical image.

SUMMARY OF THE INVENTION

Broadly speaking, the present invention covers, describes and claims an improved electrostatically deflectable devices especially useful in an array since they can be driven with co-incident voltages and can be used as either a display or a memory.

More particularly the invention describes an improved deformographic device comprising: a substrate, a cantilevered beam supported over said substrate, means for impressing a selective voltage on the substrate, a pair of conductive leads on said beam, means for applying selected voltages on each of said leads to electrically deflect the beam with respect to the substrate, and means for reducing said selected voltage to a standby level sufficient to maintain said deflected beam in said deflected position.

DESCRIPTION OF THE PREFERRED EMBODIMENTS

Figure 1:
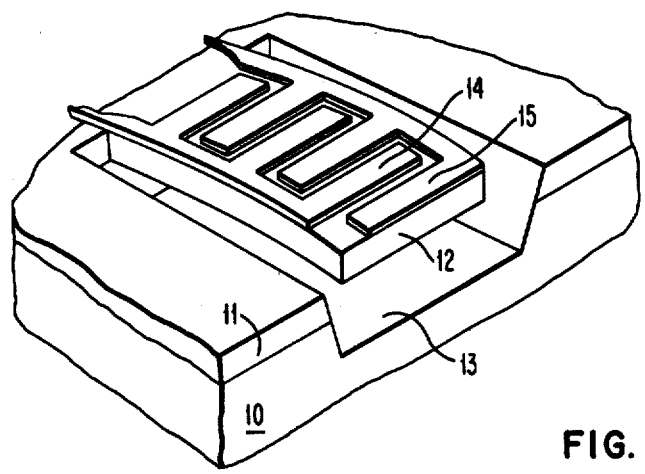
FIG. 1 is a pictorial partially cross-sectioned view of an embodiment of the invention.

FIG. 1 illustrates a partically cross-sectioned, pictorial view of the preferred embodiment of the invention in which the localized stress due to the electrostatic force on the beam is modified by formation of an interdigitated electrode structure on the surface of the beam.

The embodiment shown comprises a body 10 of semiconductor material, such as silicon, having a layer of insulating material, such as silicon oxide, on one surface thereof. A cantilevered beam 12 of this oxide material is formed by cutting a U-shaped trench in the oxide and etching a pit in the silicon body beneath the beam 12. On the surface of the beam there are formed two interdigitated electrodes 14 and 15.

Figure 2:
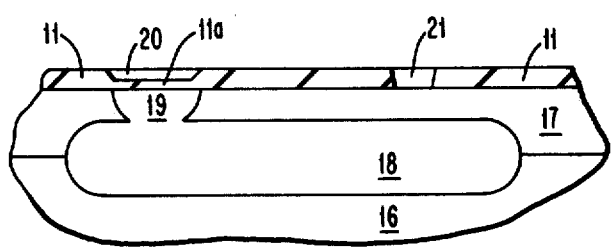
FIG. 2 is a cross sectional view of the device during one stage of its construction.
Figure 3:
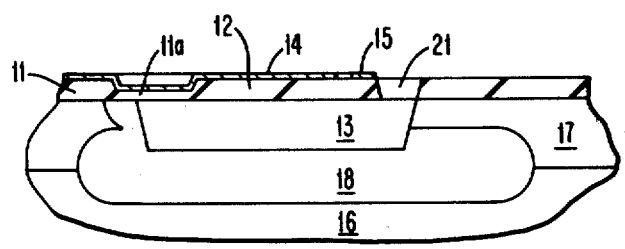
FIG. 3 is a cross sectional view of the device in its final stage.

FIG. 2 illustrates a sectional view of the device of FIG. 1 during one stage of its construction. The body 10 is comprised of a p-type substrate 16 having an epitaxial layer 17 formed thereon with a p+ type region 18, doped with boron to a concentration peak exceeding typically $7 \times 10^{19}$, disposed between the epitaxial layer 17 and the substrate 16. Another p-type region 19 is formed in the epitaxial layer 17 through an opening 20 in the oxide layer 11. Once the region 19 is formed so that it extends down from the surface of the epitaxial layer 17 to merge with the p-type region 18, an oxide 11a is regrown in the opening 20. This regrown layer 11a is considerably thinner than the original oxide 11 because of the methods used to regrow such oxides.

Once this oxide regrowth is completed a U-shaped trench 21 is formed in the oxide layer 11 overlying the p-type region 18 with the open end of the U enclosing the region 19. This U-shaped etch defines the oxide beam 12. The pit 13 is formed by introducing a selective anisotropic etchant through the opening 21 so that the silicon body 17 is etched away beneath the beam 12 leaving it in a cantilevered position over the pit 13. Boron to the described concentration levels is used to limit the amount of vertical etching when anistropic etchants are used. A metal for forming the electrodes 14 and 15 is then deposited over the surface of the beam and the interdigitated electrodes 14 and 15 defined therein. Because this regrown oxide layer 11a is substantially thinner than the oxide covering the beam 12, it acts as a hinge when the pit 13 extends under it and helps to lower the stress when the beam is deflected under the influence of an electrostatic force developed by biasing the electrodes 14 and 15 with respect to the underlying P region 18. The pit 13, of course, also permits the beam to deflect downwards. When no voltages are applied to the electrodes, it being assumed that the effect of gravity is negligable, the beam 12 experiences no deflection. As the voltage increases, there is some deflection of the beam until the voltage reaches a critical level called the threshold voltage. At this threshold voltage, the electrostatic forces overcome the internal forces of the beam and the beam suddenly snaps down into a fully deflected position with the end of the beam touching the bottom of the pit. Because the beam is formed of an insulating material the electrodes are prevented from touching the bottom of the pit.

If, at any time before this threshold voltage is reached, the voltage is reduced, the beam will return towards its initial position.

However, after the voltage exceeds this threshold level and the beam has snapped into a fully deflected position, the voltage can be reduced below threshold and still maintain the beam in its deflected position. Indeed, before the beam will return to its initial undeflected position, after having been put into a fully deflected position, the applied voltage must fall below a minimum holding voltage which is nearly zero volts. This minimum holding voltage is that voltage at which the electrostatic force falls below the level of the internal stresses in the deflected beam. When this minimum holding is reached the beam will suddenly snap back to its initial zero position.

The position of the beam can be used to store information. Thus the deflected beam can be a "1" and the undeflected beam a "0". The position of the beam is determined by impinging a ray of light normal to the undeflected surface of the beam and placing an optical detector normal to the fully deflected position of the beam. Thus when the beam is in its initial undeflected position the ray of light is reflected back to its source and the detector is dark and thus can represent a zero. When the beam is fully deflected and the ray of light impinges on the deflected end it is reflected, from the beam at an angle to its original path, and becomes diverted toward the detector. This detected beam can represent a "1".

When two interdigitated electrodes are used on the surface of the beam the voltage applied to both electrodes must be equal to the threshold level before the beam will fully deflect. If two different voltages are applied and one is below the threshold level while the other is at the threshold level the beam will not fully deflect.

For example, if we designate that the voltage applied to electrode 14 with respect to the substrate to be Vx and the voltage applied to the electrode 15 with respect to the substrate to be Vy then at $Vx = Vy = 0$ Volts
   The beam is flat
at $Vx =$ Threshold Voltage $Vy = 0$ Volts
   The beam is not fully deflected
at $Vx =$ Threshold Voltage $Vy = \frac{1}{2}$ Threshold Voltage
   The beam is not fully deflected
at $Vx = Vy =$ Threshold Voltage
   The beam is fully deflected Once the beam is deflected, the voltages on both of the electrodes could be reduced to one-half the threshold voltage and still cause the beam to remain in its deflected position.

Because of the difference in position in the fingers with respect to the end of the beam the threshold for the case where Vy is greater than Vx is smaller than the case where Vy is less than Vx. Since the end most element of the electrode at the distant end, or tip of the beam, is element 15, i.e., Vy produces the greatest force on the beam and thus the most bending movement because for any given voltage the force on the beam is proportional to the square of the reciprocal distance between the electrodes. This basically says that the minimum holding force on the beam required to keep it in a fully deflected position is a complex function of the voltages of both electrodes and that the voltage should never go to zero but should always be at a standby voltage, somewhat in excess of zero. This standby voltage should be for example about one-half the threshold voltage.

This basically says Vx does not have to be brought to ground to cause the device to switch back to its undeflected position. Thus Vx need only be at threshold or one-half threshold while the other line is tri-state threshold to deflect the device, one-half threshold to hold it fully deflected if previously fully deflected and zero volts to permit the beam to return from a fully deflected position to an undeflected position. This can be better appreciated from the following truth table.

| Value of Vx | Value of Vy | Result |
|---|---|---|
| 0 | 0 | No deflection |
| V standby | 0 | slight deflection |
| 0 | V standby | slight deflection |
| V standby | V standby | slight deflection |
| V threshold | 0 | slight deflection |
| 0 | V threshold | slight deflection |
| V threshold | V threshold | full deflection |
| V standby | V threshold | retains full deflection |
| V threshold | V standby | retains full deflection |
| V standby | V standby | retains full deflection |
| V standby | 0 | released from full deflection |

This arrangement of interdigitated electrodes now gives the capability of easily forming an x-y array in any size in which each device can readily and easily be written into and held in a deflected state. Thus the present invention results in an array that can be used as a memory or storage which is twice as dense as was the prior art arrays and which can easily be written with two co-incident voltages, i.e., one applied to electrode 14 and the other applied to electrode 15. Also only two voltage levels, i.e., one-half threshold and threshold, above ground or zero volts are required.

By reducing the thickness of the oxide 11a over the diffusion 19 the amount of voltage required for deflection is reduced. Such a reduction in deflection force is also realized by either producing an opening in the beam or by narrowing of the beam at its proximal end, i.e., its juncture with the main oxide layer. Such opening or narrowing reduces the movement of inertia of the beam, thus reducing the level of the necessary deflecting force and the required threshold voltage.

Figure 4:
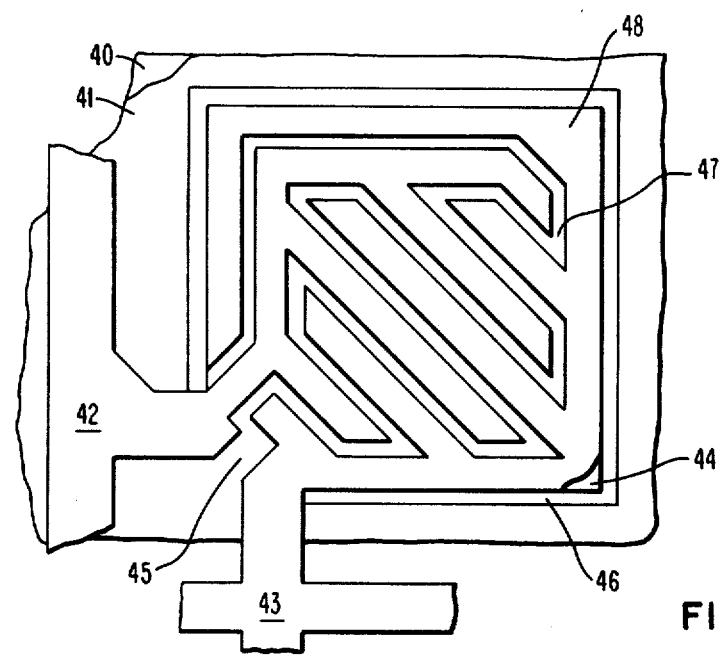
FIG. 4 is a top view of a different embodiment of the invention.

Instead of a rectangular beam as shown in FIG. 1, other embodiments can also be made. One such embodiment is shown in FIG. 4. This FIG. 4 depicts a semiconductor body 40 having an oxide layer 41 on the surface thereof. Formed in this oxide layer 41 is a substantially square oxide beam 44 suspended over an etched pit 46 provided in the body 40, by a hinge 45 located on one corner of the beam. The other three corners of the beam are freely cantilevered over the pit 46. Two interdigitated electrodes 42 and 43 are disposed over the beam 44. The electrode 42 is substantially enclosed by the electrode 43. The electrodes 42 and 43 are separated one from the other, over the beam, by a space 47.

This electrostatic deformographic device operates in the same manner as does the device shown in FIG. 1. However, in this case the corner 48 of the beam, which is diagonally opposite the hinge 45, is the point of greatest deflection when voltages above the threshold voltage are applied to the electrodes 42 and 43.

When these deformographic devices are arranged in x-y arrays, this corner deflectable device has a distinct advantage over that shown in FIG. 1. In this case when the light ray is directed against a deflected corner 48, it will be reflected at an angle of 45° with respect to the lines of the array, thus the possibility of erroneous detection due to noise or inadvertent reflection or diffraction from the periodic array is lessened.

Figure 5:
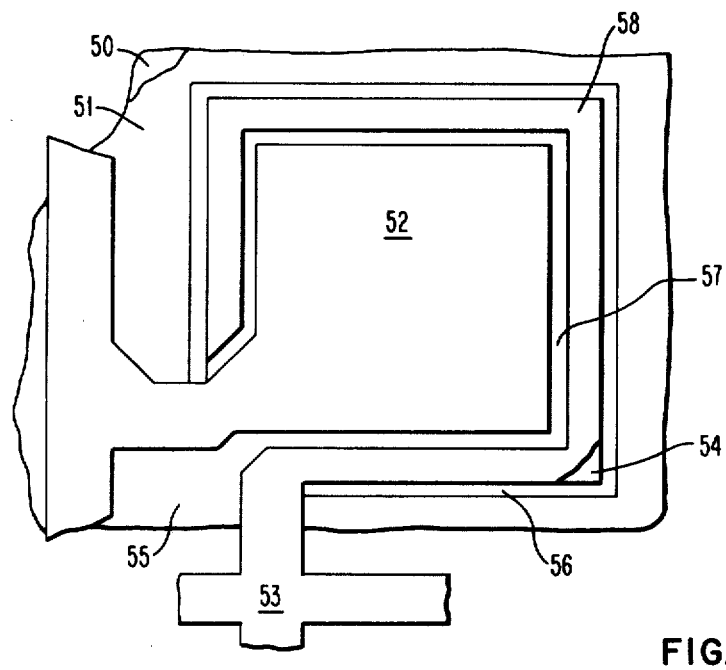
FIG. 5 is a top view of still another embodiment of the invention.

FIG. 5 depicts still another embodiment. The device shown in FIG. 5 is substantially the same as the device shown in FIG. 4. This semiconductor body 50 is covered with an oxide layer 51 which was defined therein a substantially square oxide beam 54 suspended by a corner hinge 55 over a pit 56 etched in the body 50. A first substantially square electrode 52 is disposed over the center of the beam 54 and a second line electrode 53 is formed around the electrode 52 so as to substantially enclose the electrode 52. These electrodes are separated by a space 57. This device operates similar to the device shown in FIG. 4 such that when both electrodes 52 and 53 have voltages equal to the threshold voltage of the device, applied there to the corner 58 diagonally opposite the hinge 55 will be deflected downwards into the pit 56. The advantage of this design over the interdigitated design of FIG. 4 is that the large area of electrode 52 provides a better target for a ray of light and also eliminates any possiblity diffracted energy in the direction of the reflected beam due to alleviating interdigitated fingers as might be realized by use of the design of FIG. 4.

Figure 6:
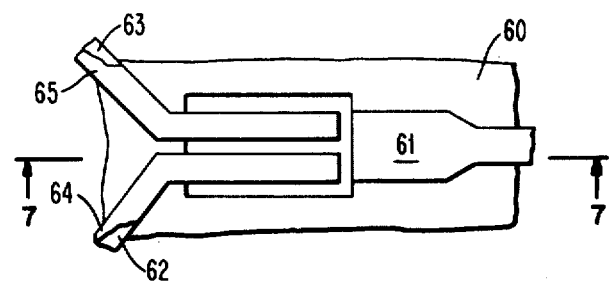
FIG. 6 is a top view of a device, embodying the present invention, used as an optical waveguide transmitter-receiver switch.
Figure 7:
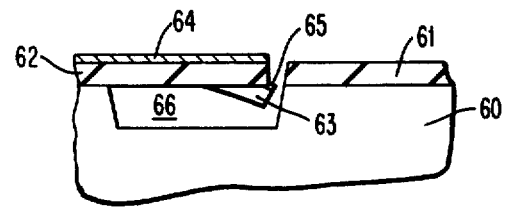
FIG. 7 is a cross sectional view of the device of FIG. 6 taken along the line 7—7.

FIGS. 6 and 7 illustrate a two electrode deformographic device used as an optical waveguide transmitter/receiver switch.

Shown in these figures is a body 60 of semiconductive material on the surface of which there is supported three distinct optical waveguide elements 61, 62, and 63 formed on a transparent material and capable of carrying light signals. Two of the waveguides 62, and 63 are covered with metallic electrodes 64 and 65 respectively. These two coated electrodes extend in cantilevered fashion over a pit 66 formed in the body 60. The cantilevered end of each of these waveguides 62 and 63 are arranged to be directly opposed to and in close proximity and optically coupled to the end of the third guide 61 which terminates on the edge of the pit 66.

One of the coated waveguides, say 62 is coupled to an optical, light transmitter while the other coated waveguide 63 is coupled to an optical, light receiver. The third electrode 61 is used for bidirectional flow of optical data.

By suitably biasing one electrode or the other to over the threshold voltage with respect to the underlying body 60 either waveguide 62 or 63 can be coupled from the bidirectional guide. This is especially shown in FIG. 7 where the guide 62 is shown in its normal undeflected position and the guide 63 is shown deflected into the pit 66. Thus the guide 62 is optically coupled to guide 61 and the guide 63 is optically decoupled from the guide 61 and unable to receive signals therefrom. When the voltage is removed the guide 63 will return to its initial position and again be optically coupled to the bidirectional guide 61.

Figure 9:
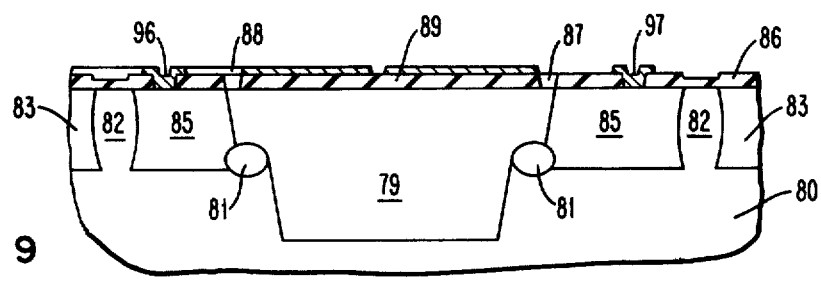
FIG. 9 is a cross section of the device of FIG. 8 taken along the lines 9—9.
Figure 8:
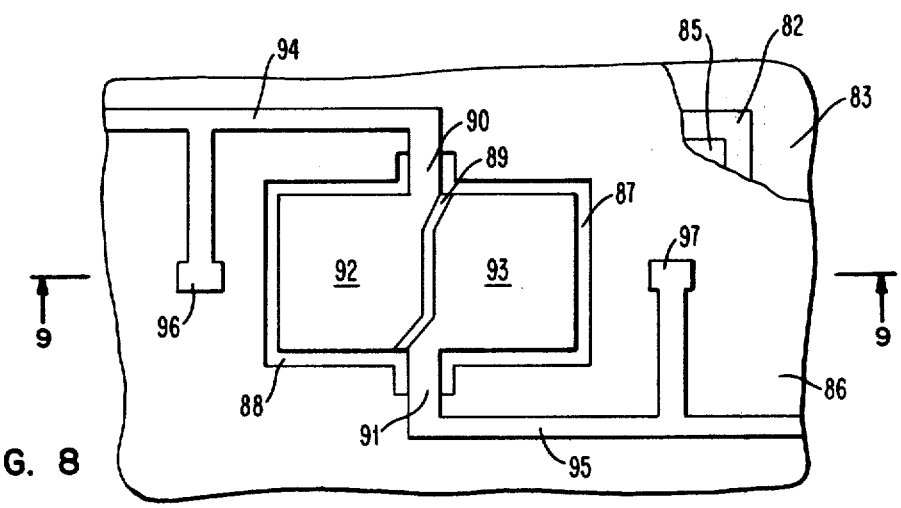
FIG. 8 is a top view of still another embodiment of the invention.

FIGS. 8 and 9 show still another variation of the invention. In this embodiment p-type body 80 has an epitaxial layer 83 formed thereon. In this eptiaxial layer there are two p+ regions, 81 and 82. Both of these regions 81 and 82 are generally rectangular in form, are hollow and concentric. The region 81 is buried at the juncture of the body 80 and the epitaxial layer 83 while the outer region 82 extends down from the surface of the epitaxial layer 83 to define an enclosed isolated region 85 of the epitaxial layer which also encloses the region 81. An oxide layer 86 overlies the entire epitaxial layer. Openings 87 and 88 are made in the oxide 86 and define a generally rectangular area of oxide 89. These openings 87 and 88 each overlies approximately one-half of the p+ region 81. It should be noted that the openings 87 and 88 do not meet thus permitting the area 89 of oxide generally enclosed by the opening 87 and 88 to be connected to the main body by oxide bridges 90 and 91. A pit 79 is etched in the epitaxial layer 83 and body 80 beneath the oxide area 89. It should be noted that the pit exposes the p+ region 81. Metal electrodes 92 and 93 are deposited over the oxide area 89. It is to be noted that each electrode extends over a respective bridge 90 and 91 to respective metal lines 94 and 95 leading to respective epitaxial contacts 96 and 97 and off chip to a suitable biasing source. The device operates as follows. A voltage with respect to the substrate 80 is impressed on only one of the electrodes, say for example electrode 92. As the voltage is increased the electrostatic forces causes the oxide layer 89 over the pit 79 to rotate around the bridges 90 and 91 such that the electrode 92 goes towards the p+ region 81 and the electrode 93 moves away from the p+ region 81. The enclosed epi pockets at each end are biased at the same potential as their corresponding electrodes thereby preventing lateral movement of the entire beam.

Conversely when the electrode 93 is appropriately biased and electrode 92 is biased below the threshold voltage the oxide layer 89 rotates in the other direction.

Figure 10:
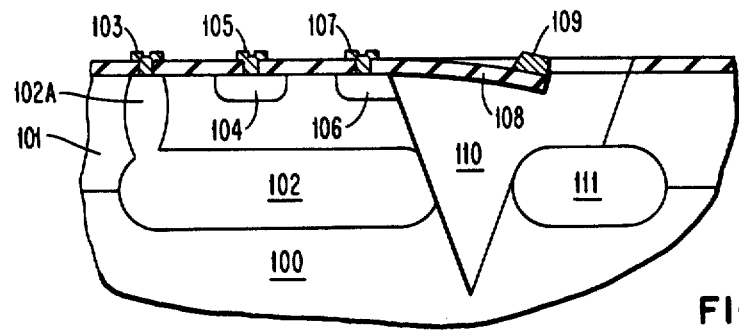
FIG. 10 is a sectional view of a deformographic device used as an accelerometer.
Figure 11:
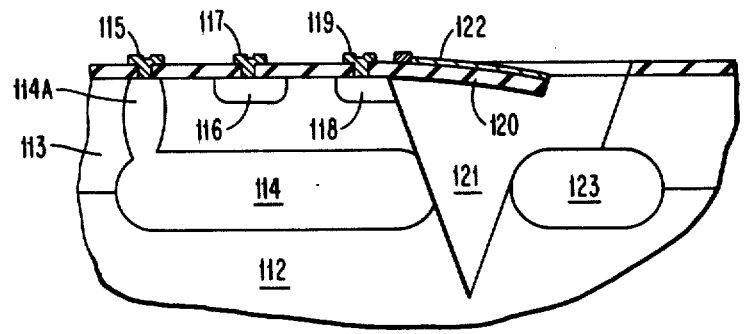
FIG. 11 is a sectional view of a deformographic device used as a feedback transistor.
Figure 12:
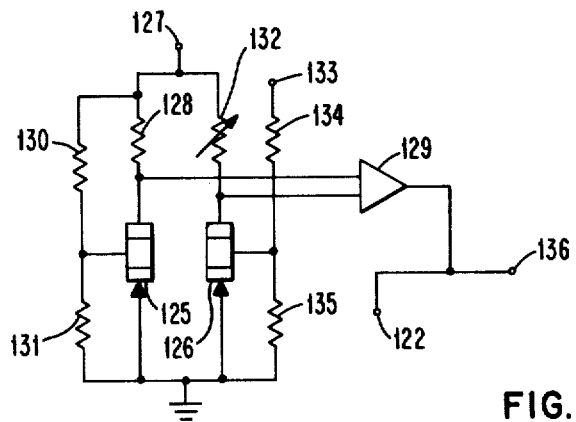
FIG. 12 is a schematic for using the accelerometer and feedback transistors of FIGS. 10 and 11.

Still another embodiment of the invention is shown in FIGS. 10 to 12. In this embodiment two similar devices would be created in the same body of silicon, one acting as a reference transistor and the other an accelerometer transistor. FIG. 10 illustrates in sectional form a transistor useful as an accelerometer. This comprises a p-type substrate 100, an n-type epitaxial layer 101 and n+ diffusion 102 which can extend in part via reach through diffusion 102a to the surface of the epitaxial layer 101 and is contacted by a base electrode 103, a p-type region 104 contacted by electrode 105 serves as a collector and a second p-type region 106 contacted by electrode 107 serves as an emitter. An oxide beam 108 having an aluminum slug 109 on its distal end overhangs a pit 110, and a p+ region 111. When used as an accelerometer the inertia of the aluminum slug 109 causes the beam to bend where it joins the emitter junction. This bending introduces stress into the junction and varies the emitter current at the biased voltage hence the collector voltage varies in accordance with the amount of acceleration.

By providing in the same body a feedback transistor formed in almost an identical manner several advantages may be realized. The feedback transistor is shown in FIG. 11. In this case the transistor comprises a p-type substrate 112, an n-type epitaxial layer 113, an n+ type diffusion 114 which can extend in part to base contact 115, via reach thru diffusion 114a, a p-type collector 116 and contact 117, a p-type emitter 118 and contact 119 and an oxide beam 120 cantilevered over a pit 121 and p+ region 123. The beam 120 is coated with a metal electrode 122 so that the beam can be electrostatically bent to apply a predetermined stress on the emitter junction of the transistor.

By putting these devices in the circuit shown in FIG. 12 any acceleration experience by the device of FIG. 10 may be made proportional to the square of the voltage applied to beam electrode 122 located next to the emitter of the transistor of FIG. 11.

FIG. 12 shows a suitable circuit and includes a transistor 125 formed as showing in FIG. 10 and a transistor 126 formed as shown in FIG. 11. A negative bias voltage source 127 is coupled through a resistor 128 to the collector of transistor 125 and through another resistor 130 to base of transistor 125 and thence through a third resistor 131 to the emitter of transistor 125 which is coupled to ground. The source 127 is coupled through a variable resistor 132 to the collector of the feedback transistor. An offset bias source 133 is coupled through a resistor 134 to base of transistor 126 and thence through a resistor 135 to the emitter of transistor 126 and ground. The collector voltage signals developed across resistors 128 and 132 are fed to differential amplifier 129. The output of the differential amplifier is connected to an out signal node 136 and to the beam electrode (i.e., electrode 122 on the beam 120) of the feedback transistor 126.

The offset voltage on transistor 126 keeps the beam biased downwards and thus provides a fixed quiesent point for the circuit (to allow for ± acceleration). As acceleration occurs a differential voltage occurs at the collectors of the two transistors. This voltage is related (in complex fashion) to the difference in stress encountered by transistor 125 due to the inertia of slug 109 and the stress encountered by transistor 126 due to the electrostatic forces on beam 120 produced by the voltage applied to electrode 122. The differential amplifier is connected in a feedback fashion such that it's output voltage, applied to electrode 122, causes the stress encountered by both transistors to equalize, thereby driving the differential collector voltages back to zero. Although the collector voltage on either transistor is a complex function of the stress applied to its associated beam, the fact that both transistors see equal stress, reduces the relation to a simple form. Since the stress on the accelerometer transistor is equal to a first constant times the acceleration and the stress on the feedback transistor is equal to a second constant times the square of the feedback voltage output of the differential amplifier applied to the beam electrode, it follows the acceleration is equal to a third constant times the square of the voltage applied to the feedback transistor beam.

While the invention has been particularly described with reference to the preferred embodiments thereof it will be understood by those skilled in the art that the foregoing and other changes in form and details be made therein without departing from the spirit and scope of the invention.

What is claimed is:

1. An improved deformographic device comprising:
   a body of semiconductive material of a first conductivity type,
   a layer of semiconductive material of a second conductivity type on said body,
   an opening in said layer extending through said layer and exposing said body,
   a coating of insulating material disposed over said layer of said second conductivity type,
   a defined beam of said insulating material extending from said coating of insulating material over said opening,
   a pair of electrodes disposed on said beam, and
   means coupled to said electrodes for independently applying to each of said electrodes, with respect to said body, a threshold voltage, said threshold voltage being sufficient to create an electrostatic attraction between both of said electrodes and said body sufficient to overcome the bending stresses in said beam when applied to both of said electrodes but insufficient to overcome the bending stress in said beam when applied to only one of said electrodes.

2. The device of claim 1 wherein said pair of electrodes are interdigitated and alternating down the beam from the proximal end of said beam to the distal end of said beam.

3. The device of claim 2 wherein said beam is provided with means at its proximal end for reducing the bending stress in said beam.

4. The device of claim 2 wherein said body and said layer are comprised of silicon and said coating is comprised of silicon dioxide.

5. The device of claim 3 wherein said means for reducing the bending stress in the beam comprises a reduction in thickness of the beam at the proximal end of said beam.

6. The device of claim 3 wherein said means for reducing the bending stress in the beam comprises a reduction in the width of the beam at its proximal end.

7. The device of claim 1 wherein said beam has a generally square configuration and its proximal end is located at one of the corners of said beam and its distant end is at the corner diagonally opposite to said proximal end.

8. The device of claim 7 wherein said electrodes are interdigitated and alternating down the beam from the proximal end to the distal end of said beam.

9. The device of claim 7 wherein one of said electrodes is square and the other of said electrode is circumferential to said first electrode.

10. An improved deformographic display comprising;
    a substrate, a cantilevered beam supported over said substrate,
    means for impressing a selective voltage on the substrate,
    a pair of conductive leads on said beam,
    means for applying selected voltages on each of said leads to electrically deflect the beam with respect to the substrate, said selected voltages being sufficient to create an electrostatic attraction between both of said electrodes and said body sufficient to overcome the bending stresses in said beam when applied to both of said electrodes but insufficient to overcome the bending stress in said beam when applied to only one of said electrodes, and means for reducing said selected voltages to a standby level sufficient to maintain said deflected beam in said deflected position but insufficient to overcome the bending stress in said beam.

11. An improved deformographic device comprising:

a body of semiconductive material of a first conductivity type, a layer of semiconductive material of a second conductivity type on said body, an opening in said layer extending through said layer and exposing said body, a coating of insulating material disposed over said layer of said second conductivity type, a defined beam of said insulating material extending from said coating of insulating material over said opening, said beam being coupled to said coating at two opposing points defining an axis of rotation for said beam, a pair of electrodes disposed on said beam, and means coupled to said electrodes for independently biasing said electrodes, with respect to said body, to a threshold voltage sufficient to create an electrostatic attraction between the biased electrode and said body sufficient to cause said beam to rotate about said axis.

12. An improved accelerometer comprising:

a body of semiconductive material of a first conductivity type, a layer of semiconductive material of a second conductivity type on said body, a first emitter base and collector region in said layer defining a first transistor, a second emitter base and collector region in said layer defining a second transistor, a pair of openings in said layer extending through said layer and exposing said body, a coating of insulating material disposed over said layer of said second conductivity type, a first defined cantilevered beam of said insulating material extending from said coating of insulating material adjacent to said first emitter region over a first one of said pair of openings, a second defined cantilevered beam of said insulating material extending from said coating of insulating material adjacent to said second emitter region over the second said pair of openings, a selected mass of metal disposed on the cantilevered end of said first beam sufficient to subject the emitter of said first transistor to a selected stress, a thin film metal electrode disposed over the entire surface of said second beam, means for biasing said first and second transistors, means coupled to said electrode for biasing said electrode, with respect to said body, to a voltage sufficient to create an electrostatic attraction between said electrode and said body sufficient to subject the emitter of said second transistor to a selected stress, and a differential amplifier coupled across the collectors of said first and second transistors for measuring the differential voltage created when said body is accelerated such that the inertia of said mass causes a change in the stress to which the emitter of said first transistor is subjected.

13. An improved deformographic device comprising:

a body of semiconductive material of a first conductivity type, a layer of semiconductive material of a second type on said body, an opening in said layer extending through said layer and exposing said body, a first defined cantilevered beam of insulating and optically conducting material extending over said opening, a second defined cantilevered beam of insulating and optically conducting material extending over said opening, a first metal electrode disposed on the entire surface of said first beam, a second metal electrode disposed over the entire surface of said second beam, an optical waveguide disposed on said layer having an end directly opposed to and in close proximity with and optically coupled to said first and said second beams, means coupled to each of said electrodes for independently biasing said electrodes, with respect to said body, to a threshold voltage sufficient to create an electrostatic attraction between said biased electrode and said body sufficient to overcome the bending stresses in the beam on which said biased electrode is disposed.

* * * * *